United States Patent [19]
Nakashima et al.

[11] Patent Number: 5,614,443
[45] Date of Patent: Mar. 25, 1997

[54] METHOD OF PRODUCING A FRAME MADE OF CONNECTED SEMICONDUCTOR DIE MOUNTING SUBSTRATES

[75] Inventors: Takashi Nakashima; Keiji Takai; Kouji Tateishi, all of Kitakyushu, Japan

[73] Assignee: Mitsui High-tec, Inc., Kitakyushu, Japan

[21] Appl. No.: 622,144

[22] Filed: Mar. 27, 1996

[30] Foreign Application Priority Data

Jul. 6, 1995 [JP] Japan .................................. 7-196157

[51] Int. Cl.$^6$ .................................................. H01L 21/60
[52] U.S. Cl. ........................ 437/209; 437/211; 437/214; 437/217; 437/220
[58] Field of Search .......................... 437/209, 211, 437/212, 214, 215, 217, 218, 219, 220

[56] References Cited

U.S. PATENT DOCUMENTS

| 5,023,202 | 6/1991  | Long et al. ............... 437/217 |
| 5,045,921 | 9/1991  | Lin et al. . |
| 5,114,880 | 5/1992  | Lin ............................. 437/217 |
| 5,188,984 | 2/1993  | Nishiguchi ............... 437/211 |
| 5,216,278 | 6/1993  | Lin et al. . |
| 5,227,338 | 7/1993  | Kryzaniwsky ........... 437/211 |
| 5,371,943 | 12/1994 | Shibata ..................... 437/220 |
| 5,376,588 | 12/1994 | Pendse ...................... 437/211 |
| 5,397,921 | 3/1995  | Karnezos . |
| 5,420,460 | 5/1995  | Massingill . |
| 5,492,866 | 2/1996  | Nishikawa ............... 437/214 |

FOREIGN PATENT DOCUMENTS

| 399456   | 4/1991  | Japan . |
| 4277636  | 10/1992 | Japan . |

*Primary Examiner*—Kevin M. Picardat
*Attorney, Agent, or Firm*—Armstrong, Westerman, Hattori, McLeland & Naughton

[57] ABSTRACT

Method of producing a frame made of connected semiconductor die mounting substrates comprises i) a first step for producing a metal substrate sheet wherein an original material for metal substrate sheet of a desired size is cut out from a metal material and an erosion preventing layer is provided on the entire surface thereof, ii) a second step for producing a circuit substrate sheet wherein the circuit substrate sheet is made of a resin substrate coated with a copper leaf layer and is provided with a lead pattern on the surface thereof in place, iii) a third step for producing a connected semiconductor die mounting substrate sheet by adhering the metal substrate sheet to the circuit substrate sheet, iv) a fourth step for forming a plurality of pilot apertures and slits on the connected semiconductor die mounting substrate sheet by press working and v) a fifth step for producing a plurality of connected semiconductor die mounting substrate frames by separating the connected semiconductor die mounting substrate sheet.

6 Claims, 9 Drawing Sheets

METHOD OF PRODUCING A FRAME MADE OF CONNECTED SEMICONDUCTOR DIE MOUNTING SUBSTRATES

BACKGROUND OF INVENTION

The present invention relates to a method of producing a frame made of connected semiconductor die mounting substrates which can be preferably used for producing BGA (ball grid array) type semiconductor devices with high productivity and high reliability, and more particularly used for BGA type semiconductor devices each of which is substantially made of semiconductor die mounting substrate which mounts a lead pattern on one surface thereof while making the other surface thereof adhered to a die mounting portion of the metal substrate.

Conventionally, the semiconductor devices such as IC (integrated circuit) and LSI (large scaled integrated circuit) are mounted in such a manner that a plurality of outer leads which are formed in a desired shape such as a J-shape or a gull-wing shape along an outer periphery of the semiconductor device are protruded outwardly and such outer leads are connected with corresponding mounting pads (or lands) of a wiring pattern formed on a mounting board of a printed wiring board (PWB) by soldering. This method, however, necessitates a relatively wide mounting region so that the method cannot meet a demand for compacting of the semiconductor devices.

For overcoming this drawback, recently, the semiconductor devices called BGA which use a plurality of solder balls as the outer connecting terminals of semiconductor devices thus realizing miniaturing of semiconductor dies, downsizing of the semiconductor devices and lowering of the production cost of the semiconductor devices have been proposed. Such devices are, for example, disclosed in U.S. Pat. No. 5,045,921 (Lin et al.), U.S. Pat. No. 5,216,278 (Lin et al), U.S. Pat. No. 5,397,921 (Karnezos), U.S. Pat. No. 5,420,460 (Massingill), Japanese laid-open patent publication HEI 3-99456 and Japanese laid-open patent publication HEI 4-277636.

In mounting such semiconductor devices on the mounting board, soluble solder balls of each semiconductor device are first aligned with corresponding mounting pads or lands of the mounting board and subsequently are mounted on the mounting pads and the soluble solder balls are reflown by heating thus enabling a simultaneous mounting of all solder balls to the mounting pads of the mounting board facilitating the mounting of semiconductor devices on the mounting board.

The above-mentioned BGA type semiconductor devices and the die mounting substrates thereof have been produced, for example, by a following method.

Namely, a metal substrate sheet which defines a plurality of longitudinally and laterally arranged unit regions in an abutting relationship is produced from a metal sheet having a favorable heat conductivity, wherein each unit region includes a die mounting portion. Subsequently, a circuit substrate sheet which defines a plurality of longitudinally and laterally arranged unit regions in an abutting relationship is produced, wherein each unit region is provided with an opening at the center thereof and a lead pattern made of a plurality of conductive leads distributed radially around the opening and a solder resist layer which is provided with a plurality of spaces through which the conductive leads are exposed to an atmosphere in an area arrayed manner.

On the surface of the circuit substrate sheet which opposes to the surface thereof on which the lead pattern is provided, the metal substrate sheet is laminated and heat sealed by means of a heat-resistant adhesive layer to produce a semiconductor die mounting substrate sheet 217 shown in FIG. 12. A plurality of longitudinally and laterally arranged unit regions 215 are integarally mounted on the semiconductor mounting substrate sheet 217 and each unit region 215 is provided with an opening 216 at the central portion thereof for mounting a semiconductor die. Subseqeuntly, this semiconductor mounting substrate sheet 217 is cut and separated along lateral and longitudinal separation lines 218 so as to produce a plurality of individual semiconductor die mounting substrates 219 as shown in FIG. 13.

These semiconductor die mounting substrates 219 are mouted on a transfer carrier (not shown in the drawings) or are individually fed to a semiconductor die assembly line and positioned in place and a semiconductor die 221 is mounted on each semiconductor die mounting susbtate 219 by means of an electrically conductive adhesive agent as shown in FIG. 14. Subsequently, a plurality of bonding wires have one ends thereof connected with corresponding ends of a plurality of wire bonding pads 222 and other ends connected with a plurality of electrode terminals mounted on the semiconductor die 221 so as to provide an electrically conductive circuit. Then, as shown in FIG. 14, a potting molding is carried out so as to hermetically seal the semiconductor die 221, the bonding wires, the wire bonding pads 222 and the inner ends of the solder resist layer 223 with a potting resin 224. Finally, a plurality of solder balls which are protruded outwardly from the solder resist layer 223 are connected to a plurality of outer connecting terminals which are exposed on the solder resist layer 223 in a grid array manner so as to produce a semiconductor device 220.

In the above conventional method of producing a semiconductor device, however, the metal substrate sheet and the circuit substrate sheet which are respectively provided with a plurality of separate or individual unit regions are first heat sealed together to form the semiconductor die mounting substrate sheet 217 and subsequently the sheet 217 is cut and separated to produce a plurality of individual semiconductor die mounting substrates 219. Accordingly, at the time of mounting the semiconductor dies 221, the transferring and the positioning of the individual semiconductor die mounting substrates 219 become cumbersome, the quality of the semiconductor devices 211 and the operability of the semiconductor die mounting operation are worsened and the productivity of the semiconductor devices are drastically decreased.

Still furthermore, the accurate positioning of the respective semiconductor die mounting substrates 219 on the the transfer carrier requires expensive die mounting facilities thus increasing the production cost of semi conductor devices.

Accordingly, it is an object of the present invention to provide a method of producing a frame made of connected semiconductor die mounting substrates for BGA type semiconductor devices which can overcome the above-mentioned drawbacks of the conventional method, wherein the method is preferably used in the manufacturing of semiconductor mounting substrates and can improve the trasferring and positioning efficiency at the time of mounting semiconductor dies on the semiconductor die mounting substrates thus facilitating the mounting of semiconductor dies and eventually enhancing the productivity of the semi conductor devices.

It is another object of the present invention to provide a method of producing a frame made of connected semiconductor die mounting substrates which can utilize existing semicondutor mounting facilities with conventional lead frames for producing the frame made of connected semiconductor die mounting substrates thus obviating the purchasing of new facilities or new transfer carrier jigs and eventually can produce the frames made of connected semiconductor die mounting substrates economically.

It is still another object of the present invention to provide a method of producing a frame made of connected semiconductor die mounting substrates which can obviate the cumbersome transferring and positioning operations which are necessary in the conventional method using the individual semiconductor die mouting susbtrates thus enhancing the operability of the mounting of the semiconductor dies.

SUMMARY OF INVENTION

The first aspect of the present invention discloses a method of producing a frame made of connected semiconductor die mounting substrates, wherein i) a plurality of semiconductor die mounting substrates are connected in series in one direction by means of a plurality of connecting tabs, ii) the each semiconductor die mounting substrate has a die mounting portion at a central portion thereof and a plurality of conductive leads around the die mounting portion, and each conductive lead is provided with a wire bonding pad at an inner end thereof and a terminal pad at an outer end thereof and a solder resist layer is formed on the semiconductor die mounting substrate with an exception of the wire bonding pads and the terminal ends, iii) and a pair of side rails each of which is provided with a plurality of positioning pilot apertures are connected to respective sides of the connected semiconductor die mounting substrates by means of a plurality of connecting tabs, comprising:

a) a first step for preparing a metal substrate sheet which has an area capable of covering and defining a plurality of contiguous strip-like regions, the each strip-like region having an area capable of defining a plurality of the connected semiconductor die mounting substrates which are connected by the connecting tabs and the side rails connected to respective sides of the connected semiconductor die mounting substrates, the each strip-like region provided with a plurality of the spaced-apart die mountng regions, b) a second step for preparing a circuit substrate sheet defining a plurality of contiguous regions which are aligned with the strip-like regions of the metal substrate sheet, the each region defining a plurality of openings which register with the die mounting portions of the metal substrate sheet and provided with a plurality of the conductive leads formed around the openings, c) a third step for producing a connected semiconductor die mounting sheet by heatsealing the circuit substrate sheet on the metal substrate sheet while aligning the die mounting portion of the metal substrate sheet with the opening of the circuit substrate sheet, the connected semiconductor die mounting sheet provided with a plurality of cavities each of which is defined by the each die mounting portion of the metal substrate sheet and the each opening of the circuit substrate sheet, d) a fourth step for producing a plurality of the semiconductor die mounting substrates which are connected in series in one direction and the side rails connected to respective sides of the semiconductor die mounting substrates in the each region defined in the connected semiconductor die mounting substrate sheet by forming a plurality of slits on the semiconductor die mounting substrates, the step further including forming a plurality of the positioning pilot apertures with reference to the respective cavities, and e) a fifth step for separating the frame made of connected semiconductor die mounting substrates along the strip-like region.

The second aspect of the present invention discloses a method of producing a frame made of connected semiconductor die mounting substrates, wherein i) a plurality of semiconductor die mounting substrates are connected in series in one direction by means of a plurality of connecting tabs, ii) the each semiconductor die mounting substrate has a die mounting portion at a central portion thereof and a plurality of conductive leads around the die mounting portion, and each conductive lead is provided with a wire bonding pad at an inner end thereof and a terminal pad at an outer end thereof and a solder resist layer is formed on the semiconductor die mounting substrate with an exception of the wire bonding pads and the terminal ends, iii) and a pair of side rails each of which is provided with a plurality of positioning pilot apertures are connected to respective sides of the connected semiconductor die mounting substrates by means of a plurality of connecting tabs, comprising:

a) a first step for preparing a metal substrate sheet which has an area capable of covering and defining a plurality of contiguous strip-like regions, the each strip-like region having an area capable of defining a plurality of the connected semiconductor die mounting substrates which are connected by the connecting tabs and the side rails connected to respective sides of the connected semiconductor die mounting substrates, the each strip-like region provided with a plurality of spaced-apart die mounting portions, b) a second step for preparing a circuit substrate sheet having an area which covers at least a plurality of the strip-like regions and forming the openings on circuit substrate sheet which respectively align with the die mounting portions defined in the respective strip-like region of the metal substrate sheet, c) a third step for producing a pressure-sealed laminated sheet by adhering the circuit substrate sheet having a plurality of openings prepared in the second step to a front surface of the metal substrate sheet, d) a fourth step for producing a plurality of pressure-sealed laminated plates which are connected in series in one direction and the side rails connected to respective sides of the pressure-sealed laminated plates, wherein the pressure-sealed laminated plates are produced by forming a plurality of slits on the pressure-sealed laminated sheet and the step further includes forming a plurality of the positioning pilot apertures in the side rails, e) a fifth step for providing a photoresist layer on the each pressure-sealed laminated plate, wherein a removable resin is filled in the opening of the circuit substareate sheeet and the surface of the circuit substrate sheet is made smooth and a pair of photoresist films are adhered to the front surface of the circuit substrate sheet and the rear surface of the metal substrate sheet respectively, f) a sixth step for exposing a lead pattern on the photoresist layer on the front surface of the circuit substrate sheet and removing non-exposed portions of the photoresist layer after developing and providing a plurality of conductive lead patterns on the circuit substrate sheet by removing the photoresist layer after effecting an ectching treatment and removing the resin filled in the opening, and g) a seventh step for separating the frame made of connected semiconductor die mounting substrates from the connected semiconductor die mounting sheet along the strip-like region.

The third aspect of the present invention discloses a method of producing a frame made of connected semiconductor die mounting substrates, wherein i) a plurality of semiconductor die mounting substrates are connected in series in one direction by means of a plurality of connecting tabs, ii) the each semiconductor die mounting substrate has a die mounting portion at a central portion thereof and a plurality of conductive leads around the die mounting portion, and each conductive lead is provided with a wire bonding pad at an inner end thereof and a terminal pad at an outer end thereof and a solder resist layer is formed on the semiconductor die mounting substrate with an exception of the wire bonding pads and the terminal ends, iii) and a pair of side rails each of which is provided with a plurality of positioning pilot apertures are connected to respective sides of the connected semiconductor die mounting substrates by means of a plurality of connecting tabs, comprising:

a) a first step for preparing a metal substrate sheet which has an area capable of covering and defining a plurality of connected strip-like regions, the each strip-like region having an area capable of defining a plurality of the connected semiconductor die mounting substrates which are connected by the connecting tabs and the side rails connected to respective sides of the connected semiconductor die mounting substrates, the each strip-like region provided with a plurality of spaced-apart die mounting portions, b) a second step for preparing a circuit substrate sheet having an area which covers at least a plurality of the strip-like regions and forming the openings on the circuit substrate sheet which respectively are aligned with the die mounting portions defined in the respective strip-like region of the metal substrate sheet, c) a third step for producing a pressure-sealed laminated sheet by adhering the circuit substrate sheet having a plurality of openings prepared in the second step to a front surface of the metal substrate sheet, d) a fourth step for providing a photoresist layer by firstly filling a removable resin in the opening of the circuit substrate sheet adhered in the third step making the surface of the circuit substrate sheet smooth and adhering a pair of photoresist films on the front surface of the circuit substrate sheet and the rear surface of the metal substrate sheet respectively, e) a fifth step for producing the connected semiconductor die mounting substrate sheet by firstly exposing a lead pattern on the photoresist layer on the front suraface and removing non-exposed portions of the photoresist layer after developing and providing a plurality of the conductive leads on the circuit substrate sheet by removing the photoresist layer after effecting an ectching treatment and removing the resin filled in the opening, f) a sixth step for producing the semiconductor die mounting substrates which are connected in series in one direction and the side rails connected to respective sides of the semiconductor die mounting substrates by the connecting tabs in the semiconductor die mounting sheet by forming a plurality of slits in the semiconductor die mounting substrate, the step further including forming a plurality of the positioning pilot apertures in the side rails, and g) a seventh step for separating the frame made of connected semiconductor die mounting substrates along the strip-like region.

In the fifth step of the method of producing a frame made of connected semiconductor die mounting substrates according to the second aspect of the invention as well as in the fourth step of the method of producing a frame made of connected semiconductor die mounting substrates according to the third aspect of the invention, in place of the photoresist film, the metal substarate sheet which adheres the circuit substrate sheet on the front surface thereof can be immersed in a photoresist liquid so as to provide a photoresist layer on the front surface of the circuit substrate sheet and the rear surface of the metal substrate sheet.

Furtheremore, the circuit substrate sheet which is prepared in the second step of the first aspect of the invention and in the second step of the second and third aspects of the invention, is preferably provided with a copper film layer on a front surface thereof and a prepreg layer on a rear surface thereof.

According to the method of producing a frame made of connected semiconductor die mounting substrates of the above-mentioned first to third aspects of the present invention, since the frame made of connected semiconductor die mounting substrates is formed by connecting respective semiconductor die mounting substrates to side rails provided with a plurality of positioning pilot apertures arranged in desired intervals by means of a plurality of connecting tabs, the semiconductor die mounting substrates can be handled in the same manner as that of the lead frame so that the operability of the semiconductor die mounting substrates is greatly enhanced compared to the conventional method of producing a frame made of connected semiconductor die mounting substrates.

Furthermore, the damage on the semiconductor die substrates in the handling thereof can be minimized thus increasing the quality of the semiconductor die mounting substrates which eventually assures the reliability of semiconductor devices for a long period.

Furthermore, the side rails are formed in a same construction as that of lead frames provided with a desired positioning pilot apertures arranged in predetermined intervals so that the mounting of semiconductor dies using these side rails enables the use of existing facilities for producing semiconductor devices. The use of such side rails unnecessitates expensive positioning facilities which are necessary in the conventional technique for manufacturing semiconductor devices and enhances the mounting operability of semiconductor dies.

DETAILED DESCRIPTION OF PREFERRED EMBODIMENT OF THE PRESENT INVENTION

The method of producing a frame made of connected semiconductor die mounting substrates (hereinafter called-"connected semiconductor die mounting substrate frame") of the present invention will be explained in conjunction with several embodiments shown in the attached drawings.

Figures 1, 2:
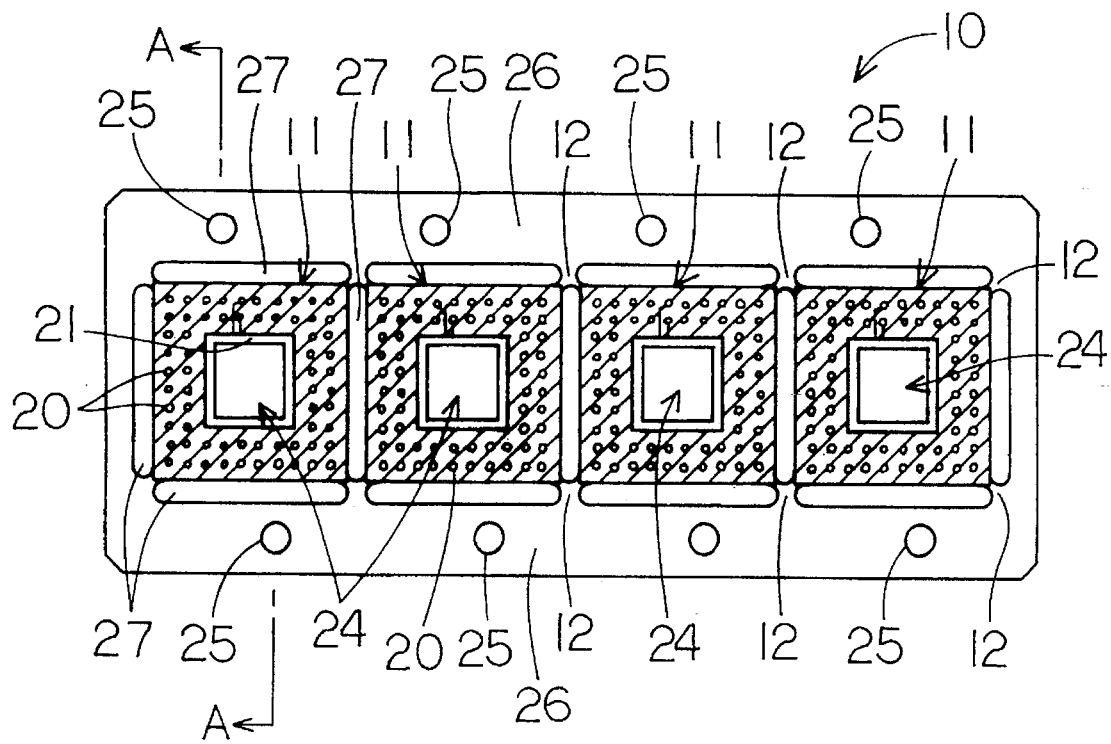
FIG. 1 is a plan view of a frame made of connected semiconductor die mounting substrates produced by the method of producing such a frame according to the first and second embodiment of the present invention.
FIG. 2 is a cross sectional view taken along A—A of FIG. 1.
Figure 3:
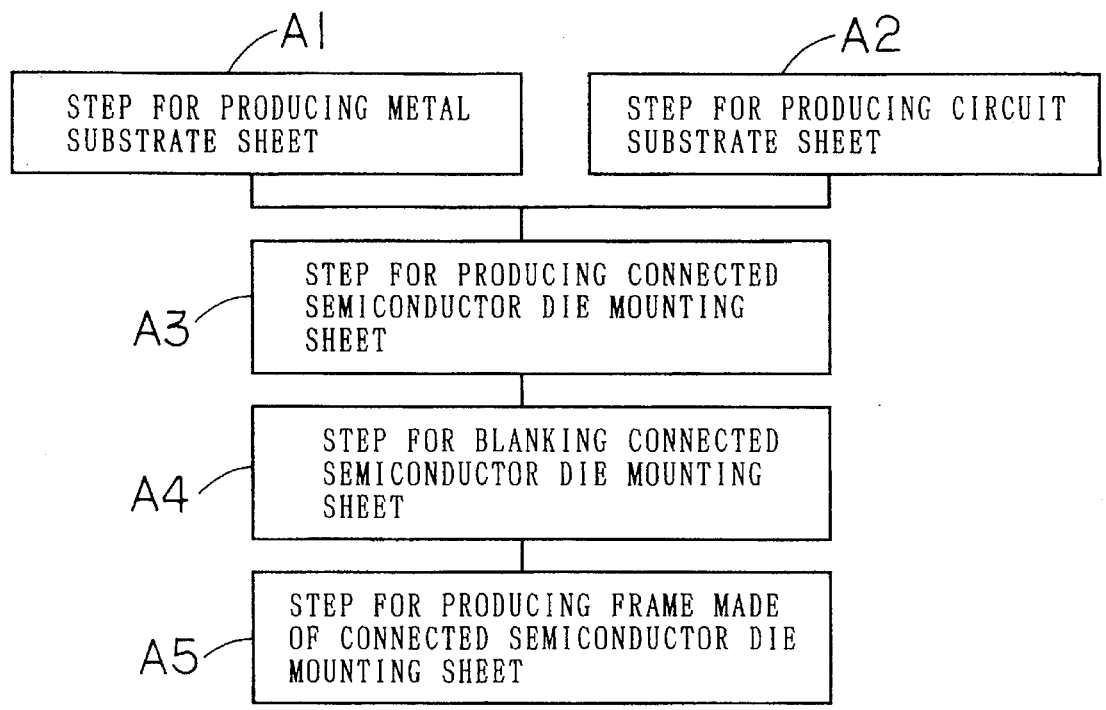
FIG. 3 is an explanatory view showing a step of the method of producing such a frame according to the first embodiment of the present invention.

The construction of a connected semiconductor die mounting substrate frame 10 is first explained in conjunction with FIG. 1, FIG. 2 and FIG. 3.

As shown in FIG. 1 and FIG. 2, the connected semiconductor die mounting substrate frame 10 substantially includes four semiconductor die mounting substrates 11 which are connected at respective corners thereof by means of a plurality of connecting tabs 12.

Each semiconductor die mounting substrate 11 includes i) a unitary metal substrate 13 being made of a copper material which has a favorable heat conductivity, ii) a unitary circuit substrate 18 which is formed by mounting a lead pattern 17 on a substrate layer 14 made of a glass fabrics reinforced epoxy resin, wherein the lead pattern 17 is made of a plurality of radially extending conductive leads 16 which encircle a central opening 15 formed on the substrate layer 14, iii) a prepreg layer 19 which is used as an adhering agent having a favorable heat conductivity for heatsealing metal substrate 13 and the circuit substrate 18, and iv) a solder resist layer 22 which covers the entire surface of the circuit substrate 18 with an exception of parts where a plurality of terminal pads 20 and a plurality of wire bonding pads 21 which are respectively formed at the outer and inner ends of the conductive leads 16 are exposed to an atmosphere.

The terminal pads 20 which are formed at the outer ends or extremities of the conducitive leads 16 are distributed in a grid array and solder balls (not shown in the drawings) are welded to the terminal pads 20 at the time of use.

A cavity 24 is defined in the semiconductor die mounting substate 11 by combining the die mounting portion 23 and the opening 15 formed in the substrate layer 14 made of a glass fabrics reinforced epoxy resin. A pair of side rails 26 are connected to respective sides of the semiconductor die mounting substrates 11 which are connected by means of the connecting tabs 12. The side rails 26 and the connecting tabs 12 are made by forming slits 27. Furthermore, the side rails 26 are respectively provided with a plurality of positioning pilot apertures 25 in longitudinally desired intervals. Thus the connected semiconductor die mounting substrate frame 10 is produced.

The method of producing the frame made of connected semiconductor die mounting substrates according to the first embodiment of the present invention is explained hereinafter in conjunction with FIG. 1 to FIG. 9.

As shown in FIG. 3, the method substantially comprises i) a first step A1 for producing a metal substrate sheet 29 wherein an original material for metal substrate sheet of a desired size is cut out from a metal material and an erosion preventing layer 28 is provided on the entire surface thereof as shown in FIG. 2, ii) a second step A2 for producing a circuit substrate sheet 30 wherein the circuit substrate sheet 30 is made of a resin substrate coated with a copper leaf layer and is provided with a lead pattern 17 on the surface thereof in place, iii) a third step A3 for producing a connected semiconductor die mounting substrate sheet 31 by adhering the metal substrate sheet 29 to the circuit substrate sheet 30, iv) a fourth step A4 for forming a plurality of pilot apertures and slits on the connected semiconductor die mounting substrate sheet by press working and v) a fifth step A5 for producing a plurality of connected semiconductor die mounting substrate frames 10 by separating the connected semiconductor die mounting substrate sheet 31.

The above-mentioned steps are explained in detail respectively hereinafter.

Figure 4:
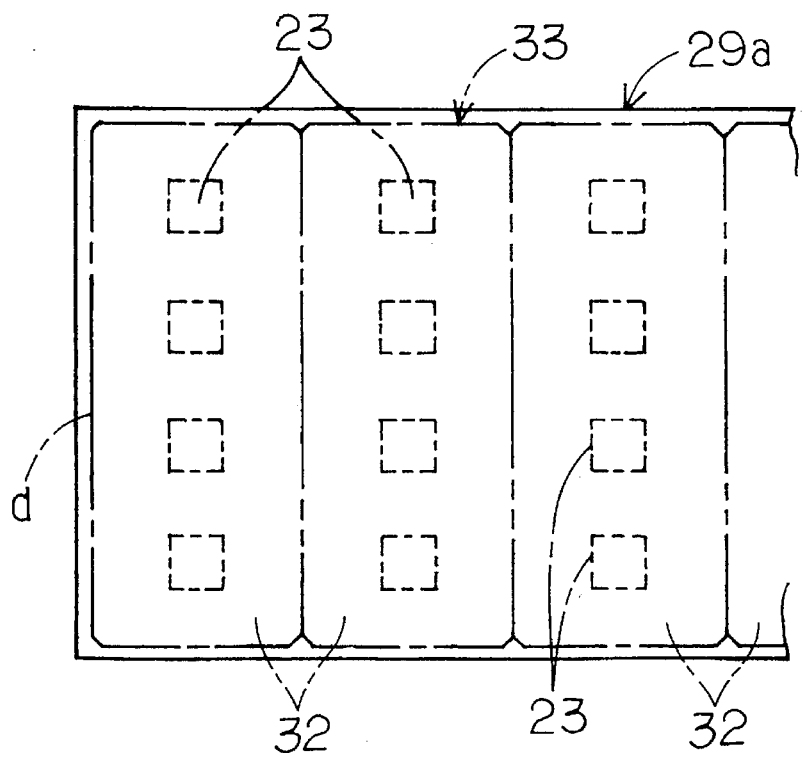
FIG. 4 is a plan view of a metal substrate sheet.

The first step A1 for producing the metal substrate sheet 29 is firstly explained in conjunction with FIG. 4.

In this step A1, copper oriented metal substrate material of a standard size or a strip-like shape which has a favorable heat conductivity and has a thickness of 0.25 to 0.55 mm is prepared.

As shown in FIG. 4, a connected region 33 is defined on the metal substrate material and such a connected region 33 has an area wider than a total area of a plurality of strip-like regions 32 which are connected in one direction. Although the number of strip-like regions 32 is four in this embodiment, the number may be more than two. Each strip-like region 32 has an area which covers the connected semiconductor die mounting substrate frame 10 which includes a plurality of semiconductor die mounting substrates 11 connected by a plurality of connecting tabs 12 and a pair of side rails 26 connected to the respective sides of the connected semiconductor die mounting substrate frame 10.

In case the metal substrate material has an area sufficiently wider than the connected region 33, a marginal area may be unnecessarily increased and such a marginal area may impede smooth operations in ensuing production steps. Accordingly, it may be preferable to cut out such a marginal area along a border line "d" shown in a dotted line in FIG. 4. In this embodiment, however, since the marginal area around the connected region 33 is small as shown in FIG. 4, the metal substrate material is used without cutting the marginal area as an original metal substrate sheet 29a.

A nickel plating 28 which is one example of an erosion plating is applied to front and rear surfaces of the original metal substrate sheet 29a as shown in FIG. 2 to produce a metal substrate sheet 29 which is provided with a plurality of strip-like regions 32 thereon. In this embodiment four strip-like regions 32 are prepared.

As shown in FIG. 4, it may be possible to differ a construction of the nickel plating 28 at the die mounting portion 23 from other portions such that a precious metal plating such as a gold plating is applied partially on the nickle plating which is used as a base. Such a construction facilitates the mounting of the semiconductor die and the die mounting portion 23 can be used as a positioning pattern at the time of adhering the circuit substrate sheet 30 to the metal substrate sheet 29.

Figure 5:
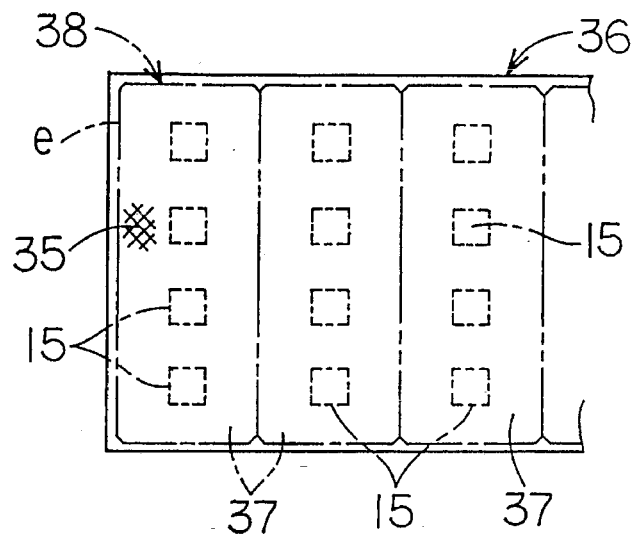
FIG. 5 is a plan view of a circuit substrate sheet.
Figure 6A:
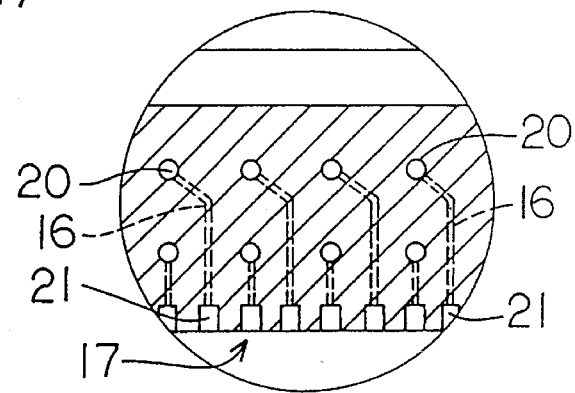
FIG. 6 is a plan view of the circuit substrate sheet provided with lead patterns.
Figure 6:
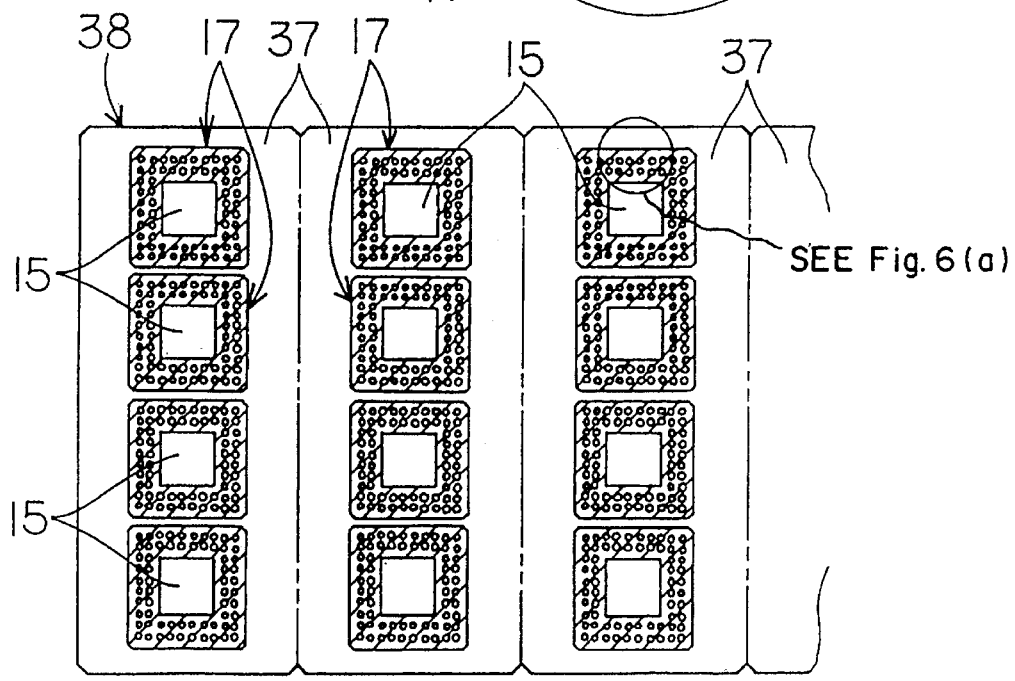
Figure 7:
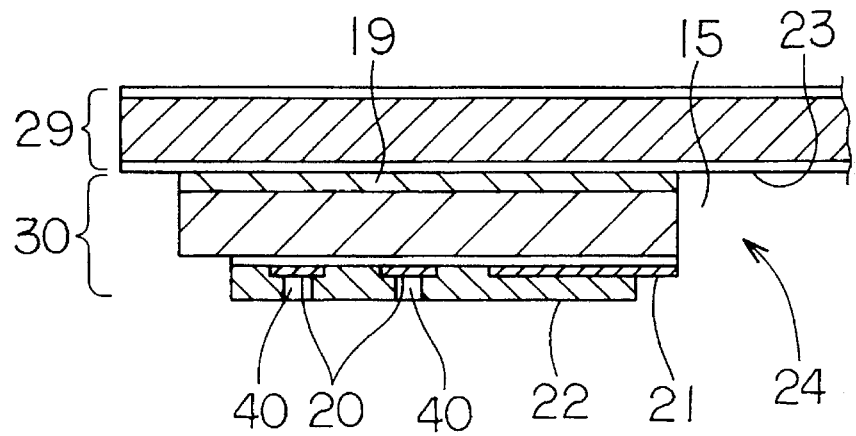
FIG. 7 is a partial cross sectional view of the circuit substrate sheet shown in FIG. 6.

The second step A2 for producing the circuit substrate sheet 30 of a desired shape according to this embodiment of the present invention is explained in conjunction with FIG. 5 to FIG. 7.

In the second step A2, as shown in FIG. 5, a circuit substrate sheet material 36 having a standard size is firstly produced by forming a copper leaf layer 35 having a thickness of 32 μm on one surface of the glass fabrics reinforced resin substrate layer (plate thickness 0.3~0.5 mm, FR-4 or FR-5) 14 as shown in FIG. 2 while forming the prepreg layer 19 on the other surface of the glass fabrics reinforced resin substrate layer 14. As the prepreg layer 19, a thermosetting resin adhesive agent having a thickness of 50~100 μm can be used.

On this circuit substrate sheet material 36, a region shown in a dotted line "e" is defined and the region is made of a plurality of connected strip-like unit frames 37. Such a region has an area which allows a lateral and longitudinal arrangement of a plurality of openings 15 (four openings 15 in this embodiment) with a desired pitch therein. The circuit substrate sheet material 36 is cut along the dotted line "e" by conventional press working or jig milling so as to produce a connected unit frame body 38 which in turn is made of four unit frames 37.

Subsequently, as shown in FIG. 6, a desired number (sixteen in this embodiment) of openings 15 are formed in the connected unit frame body 38 by conventional press working or jig milling at positions which correspond to the die mounting portions 23 of the metal substrate sheet 29. A lead pattern made of a plurality of conductive leads 16 each of which has a wire bonding pad 21 at an inner end thereof and a terminal end at an outer end thereof is formed on the surface of the copper leaf layer 35 so as to produce the circuit substrate sheet 30 having a desired shape as shown in FIG. 6.

The third step A3 for producing the connected circuit die mounting substrate sheet 31 of a desired shape is explained hereinafter.

Figure 8:
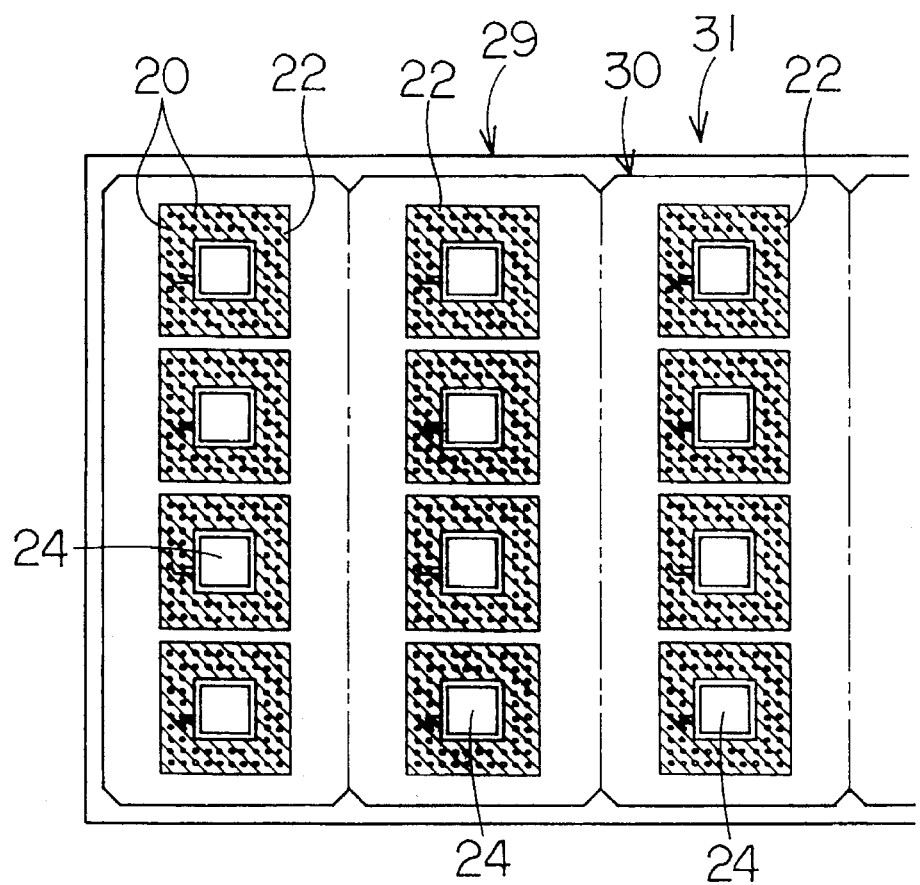
FIG. 8 is a plan view of connected semiconductor die mounting substrate sheet which is formed by connecting the circuit substrate sheet to the metal substrate sheet.

As shown in FIG. 7, in this third step A3, the metal substrate sheet 29 and the circuit substrate sheet 30 are adhered together in such a manner that firstly a cover film is removed from the prepreg layer 19 adhered to the circuit substrate sheet 30, and the openings 15 of the circuit substrate sheet 30 are aligned or registered with the die mounting portions 23 of the metal substrate sheet 29 and these sheets 29,30 are heatsealed with each other so as to define the above-mentioned cavities 24. Subsequently, with a conventional screen printing method, a solder resist layer 22 is formed on the circuit substrate sheet 30 with an exception of a plurality of spaces 40 through which the wire bonding pads 21 and the the terminal pads 20 for outer connections of the lead pattern 17 are exposed to an atmosphere so as to produce a connected semiconductor die mounting substrate sheet 31 having a desired shape as shown in FIG. 8.

In the above-mentioned second and third steps A2 and A3, the exposed portions such as the wire bonding pads 21 or the terminal pads 20 for outer connection may preferably be coated with a gold plating so as to assure a firm wire bonding while facilitating the welding of the soluble solder balls.

The fourth step A4 and the fifth step A5 for producing the connected semiconductor die mounting substrate frame 10 of a desired shape according to this embodiment is explained hereinafter.

In the fourth step A4, the connected semiconductor die mounting substrate sheet 31 produced in the third step A3 is subjected to press working or jig milling. Namely, firstly, a plurality of slits 27 having a narrow width are formed along the sides of each semiconductor die mounting substrate 11 so that some parts (four corners in this embodiment) of the semiconductor die mounting substrate 11 are connected with the neighboring semiconductor die mounting substrate 11 and the side rails 26 by means of a plurality of connecting tabs 12.

Figures 9, 9A:
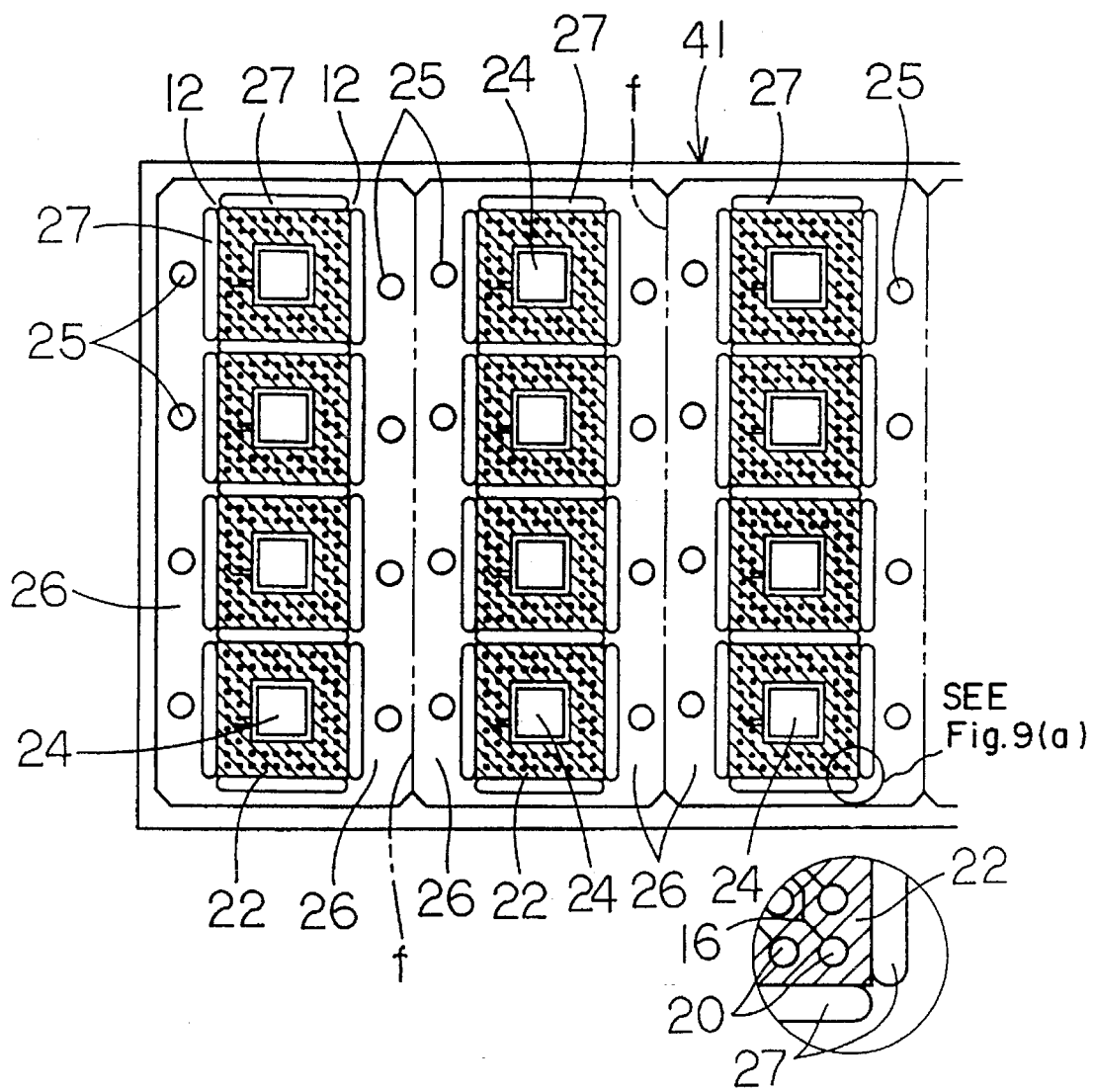
FIG. 9 is a plan view of the connected semiconductor die mounting substrate sheet provided with slits and pilot apertures.

A plurality of positioning pilot apertures 25 are formed in the side rails 26 in a spaced apart manner with reference to the openings 15 which are aligned or registered with the die mounting portions 23 so that, as shown in FIG. 9, a connected substrate sheet 41 which is made of four semiconductor die mounting sheets 31 is produced wherein each semiconductor die mounting sheet 31 includes four semiconductor die mounting substrates 11 which are connected in series in each unit frame 27.

Furthermore, in the fifth step A5, as shown in FIG. 9, the connected substrate sheet 41 which is produced from the connected semiconductor die mounting substrate 31 by press working is separated along the separation line "d" made of one dot chain line as shown in FIG. 4 and the separation line "f" made of two dot chain line as shown in FIG. 9 to provide the strip-like unit frames each of which defines the region.

Accordingly, as shown in FIG. 1 and FIG. 2, the connected semiconductor die mounting substrate frame 10 of a desired shape can be produced by firstly preparing a plurality of semiconductor die mounting substrates 11 by stacking the circuit substrate 18 on the metal substrate 13 and secondly connecting a plurlity of semiconductor die mounting substrates 11 with each other by means of the connecting tabs 12.

The manner of producing the semiconductor devices using the connected semiconductor die mounting substrate frames 10 which are produced in the above steps is explained hereinafter.

The connected semiconductor die mounting substrate frames 10 shown in FIG. 1 are intermittently supplied to the conventional semiconductor device assembly line not shown in the drawings as chip carriers. The connected die mounting substrate frames 10 are positioned in place by means of the above-mentioned pilot apertures 25 and the semiconductor dies are sequentially adhered to die mounting portions 23 through openings 15 by means of the conductive adhesive such as silver paste so as to effect the bonding of the semiconductor dies.

Subsequently, a wire bonding is carried out wherein one ends of the bonding wires are connected with corresponding wire bonding pads 21 while the other ends of the bonding wires are connected to the corresponding electrode terminals of the semiconductor dies so as to provide an electrical conductive circuit.

Thereafter, a potting molding is carried out such that the semiconductor die, the bonding wires, the inner peripheral portions of the solder resist layer 22 are hermetically sealed with a resin such as polyimide resin or the epoxy resin while forming a plurality of spaces 40 in a grid array through which a plurality of terminal pads 20 for outer connection are exposed to an atmosphere. The soluble solder balls are connected with the terminal pads 20 through the spaces 40 in such a manner that the solder balls protrude on the solder resist layer 22. Finally, the peripheral connecting tabs 12 are removed so as to produce separate and individual semiconductor devices.

As has been described heretofore, according to this embodiment, the unitary connected semiconductor die mounting substrate frame 10 is provided with a pair of side rails 26 each of which has a plurality of positioning pilot apertures 25 and such a connected semiconductor die mounting substrate frame 10 is used as a chip carrier for mounting of the semiconductor dies. Accordingly, in this embodiment, the existing mounting facilities which are used for the production of semiconductor devices using the conventional lead frames can be utilized so that the connected semiconductor die mounting substrate frames 10 which can mount the semiconductor dies can be efficiently manufactured without introducing new facilities or new transfer carrier jigs. Furtheremore, the semiconductor devices having a high quality can be produced economically.

Although the solder resist layer 22 is formed in the third step A3, in the above-mentioned embodiment, the solder resist layer 22 may be formed in any desired step provided that the step takes place after the formation of the conductive lead 16 on the circuit substrate sheet 30.

The method of producing the frame made of connected semiconductor die mounting substrates according to the second embodiment of the present invention is explained hereinafter in conjunction with FIG. 10 and FIG. 11.

In this embodiment, the elements which have the same construction as that of the above-mentioned first embodiment are depicted by the same numerals and the detailed explanation thereof is omitted.

This embodiment is substantially characterized in that in producing the connected semiconductor die mounting substrate frame 10, the formation of the lead pattern 17 by etching and the like is carried out after the circuit substrate sheet 43 which is provided with a plurality of circuit substrates 18 is adhered to the metal substrate sheet 29.

In the first step, as shown in FIG. 10 (a), the metal substrate sheet 29 having a connected region which can sufficiently cover a plurality of strip-like regions and is provided with an erosoin preventing plating on both surfaces thereof is prepared as in the case of the first embodiment. The strip-like region has an area capable of covering a plurality (four in this embodiment) of semiconductor die mounting substrates 11 which are connected in series by a plurality of connecting tabs 12 and the side rails 26 which are connected to the connected semiconductor die mounting substrates 11. On this metal substrate sheet 29, the connected region 33 which is made of a plurality of connected strip-like region 32 is defined as shown in FIG. 4.

In the second step, as shown in FIG. 10 (b), the circuit substrate sheet material 43 having an area which covers the connected region 33 is prepared. As shown in the drawing, the circuit substrate sheet material 43 adheres a copper leaf layer 35 to the front surface of the glass fabrics reinforced epoxy resin substrate layer 14 by means of the prepreg layer 45 while adhering the cover sheet 46 to the rear surface of the resin substrate layer 14 by means of the prepreg layer 19 (see FIG. 5). The copper leaf layer 35 may be directly adhered to the resin substrate layer 14 using other adhesive agent or making use of the adhesiveness of the glass fabrics reinforced epoxy resin layer 14 per se or by a vapor deposition method. A plurality of openings 15 which are aligned with a plurality of die mounting portions 23 (see FIG. 4) provided on the metal substrate sheet 29 respectively are formed in the circuit substrate sheet material 43 by blanking.

In the third step, as shown in FIG. 10 (c), the cover sheet 46 is removed from the circuit substrate sheet material 43. Subsequently, as shown in FIG. 10(d), the circuit substrate sheet material 43 is adhered to the front surface of the metal substrate sheet 29 by means of the prepreg layer 19 with a heatsealing press so as to produce a heatsealed laminated sheet 47. A plurality of cavities 24 in which semiconductor dies can be mounted are defined by combining the die mounting portions 23 of the metal substrate sheet material 11 and the openings 15 of the circuit substrate sheet material 43.

As shown in FIG. 10 (e), in the fourth step, a plurality of slits 27 are formed in the heatsealed laminated sheet 47 made of the circuit substrate sheet material 43 and the metal substrate sheet material 11 by a puncher or a milling cutter along lines which define regions corresponding to the finally produced semiconductor die mounting substrates 11 so as to produce a connected heatsealed laminated plate body which is made of a plurality of heatsealed laminated plates 48 which are connected by connecting tabs 12. Simultaneously with, before or after the formation of the slits 27, a pair of side rails 26 are connected to the respective sides of the connected heatsealed laminated plate body and a plurality of positioning pilot apertures 25 are formed in the side rails 26 by blanking.

Figure 10A:
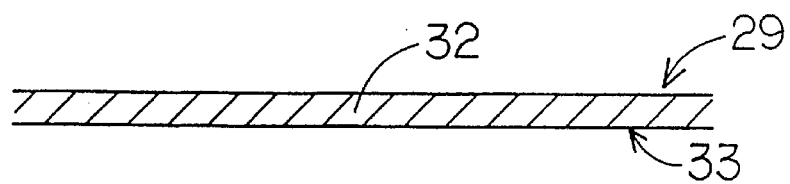
FIGS. 10 (a–f) is a block diagram showing the manner of producing the frame according to the second embodiment of the present invention.
Figure 10B:
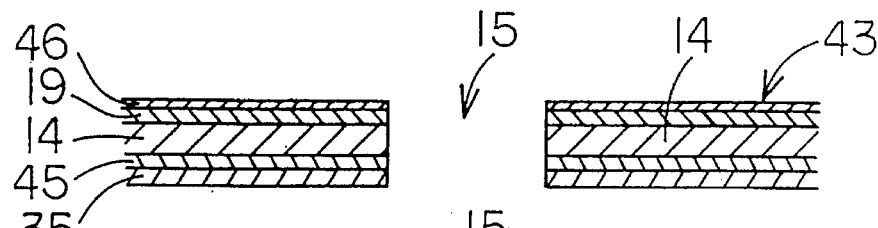
Figure 10C:
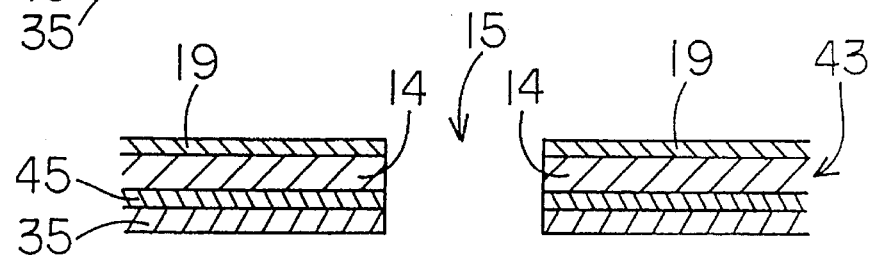
Figure 10D:
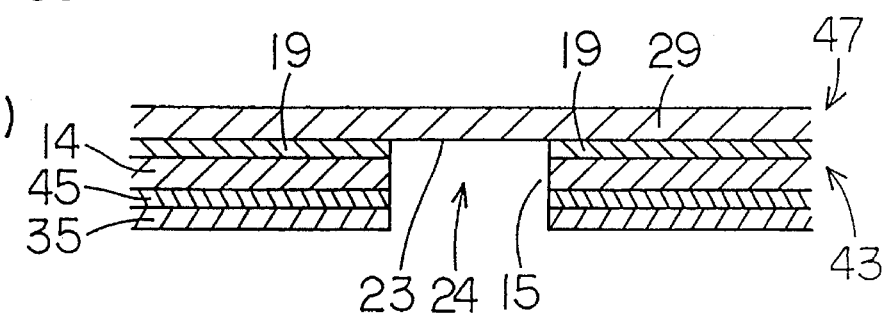
Figure 10E:
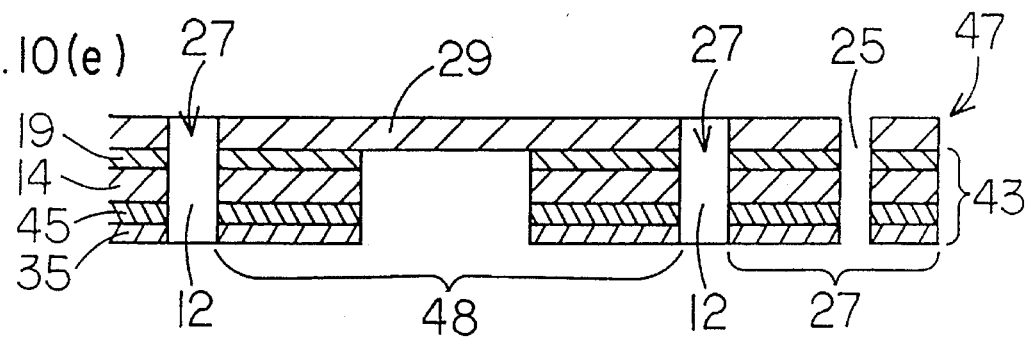
Figure 10F:
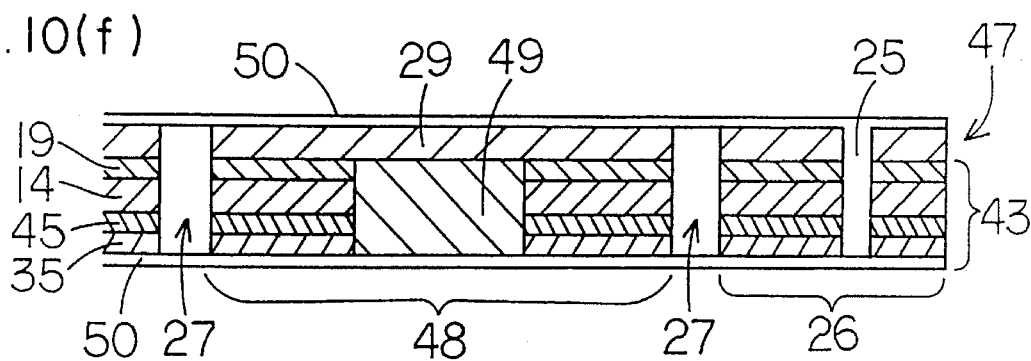

As shown in FIG. 10(f), in the fifth step, a resin 49 which can be removed in a subsequent step with an alkaline solvent is filled in the cavities 24 formed in each heatsealed laminated plate 48 in the third step. After such a resin filling operation, the surface of circuit substrate material 43 is flattened and smoothened and a photoresist film is adhered to the flattened surface to provide a photoresist layer 50 on front and rear surfaces of the heatsealed laminated sheet 47.

In the sixth step, a pattern which is the same as the lead pattern 17 is exposed on the front surface of the circuit substrate sheet material 43 and such exposed pattern is developed and non-exposed portions of the photoresist layer 50 is removed as shown in FIG. 11 (g). Subsequently, as shown in FIG. 11 (h), an etching is carried out. Then, as shown in FIG. 11 (i), the remaining photoresist layer 50 and the resin 49 filled in the cavity 24 are removed so as to provide the lead pattern 17 on the surface of the circuit substrate sheet material 43. Then, as shown in FIG. 11 (j), the solder resist layer 22 is formed on the circuit substrate sheet material 43 by a screen printing method so as to produce a connected semiconductor die mounting substrate sheet 31.

In the seventh step, as shown in FIG. 9, the connected semiconductor die mounting substrate frames 10 are separeted and removed from the connected semiconductor die mounting substrate sheet 31.

Although, in the above-mentioned second embodiment, the side rails 26 and positioning pilot apertures 25 are formed in the fourth step, such a rail and aperture forming operation can be carried out in any step after the third step where the circuit substrate sheet material 43 is adhered to the metal substrate sheet 29.

For example, the rail and aperture forming operation can be carried out after the sixth step. In this case, after adhering the circuit substrate sheet material 43 to the metal substrate sheet 29, the fourth step is skipped, and through the fifth step and the sixth step, the lead patterns 17 are formed and a desired solder resist layer 22 are formed to produce the connected semiconductor die mounting substrate sheet. Subsequently, as in the case of the above-mentioned first embodiment, a plurality of slits 27 which define the semiconductor die mounting substrates 11 having the die mounting portions 23 at the center thereof and the side rails 26 are formed in the connected semiconductor die mounting substrate sheet to provide a plurality of semiconductor die mounting substrates which are arranged in one direction and a pair of side rails 26 which are connected to the both sides of these semiconductor die mounting substrates 11 by means of the connecting tabs 12 and a plurality of positioning pilot apertures 25 are formed in the respective side rails 26.

Although, in the fifth step, the photoresist layer 50 is formed by making use of the photoresist film, in place of this photoresist film, the metal substarate sheet 29 which adheres the circuit substrate sheet material 43 on the front surface thereof is immersed in a photoresist liquid so as to fill the photoresist liquid in the cavities 24 while forming the photoresist layer 50 on an entire surface of the circuit substrate sheet material 43.

As has been described heretofore, according to this second embodiment, the unitary connected semiconductor die mounting substrate frame is provided with a pair of side rails each of which has a plurality of positioning pilot apertures and such a connected semiconductor die mounting substrate frame is used as a chip carrier for mounting of the semiconductor dies. Accordingly, in this embodiment, the existing mounting facilities which are used for the production of semiconductor devices using the conventional lead frames can be utilized so that the connected semiconductor die mounting substrate frames which can mount the semiconductor dies can be efficiently manufactured without introducing new facilities or new transfer carrier jigs. Furtheremore, the semiconductor devices having a high quality can be produced economically.

Although several embodiments have been described in detail herein with reference to the accompanying drawings, it is understood that the invention is not limited to these precise embodiments, and that various changes and modifications may be effected therein by one skilled in the art without departing from the scope or spirit of the invention as defined in the appended claims.

For example, although the metal material used in the above-mentioned embodiments has the thickness of 0.25 mm~0.55 mm, the metal material having a thickeness greater or smaller than the above value can be also used in the present invention. Furthermore, the metal is not limited to a copper-oriented metal. Still furthermore, in the embodiments, although four sets of connected semiconductor die mounting substrate frames are connected parallelly, such a set number can be determined to be two, three or more than five.

What is claimed is:

1. A method of producing a frame made of connected semiconductor die mounting substrates, wherein i) a plurality of semiconductor die mounting substrates are connected in series in one direction by means of a plurality of connecting tabs, ii) said each semiconductor die mounting substrate has a die mounting portion at a central portion thereof and a plurality of conductive leads around said die mounting portion, and each conductive lead is provided with a wire bonding pad at an inner end thereof and a terminal pad at an outer end thereof and a solder resist layer is formed on said semiconductor die mounting substrate with an exception of said wire bonding pads and said terminal ends, iii) and a pair of side rails each of which is provided with a plurality of positioning pilot apertures are connected to respective sides of said connected semiconductor die mounting substrates by means of a plurality of connecting tabs, comprising:

a) a first step for preparing a metal substrate sheet which has an area capable of covering and defining a plurality of contiguous strip-like regions, said each strip-like region having an area capable of defining a plurality of said connected semiconductor die mounting substrates which are connected by said connecting tabs and said side rails connected to respective sides of said connected semiconductor die mounting substrates, said each strip-like region provided with a plurality of said spaced-apart die mounting regions, b) a second step for preparing a circuit substrate sheet defining a plurality of contiguous regions which are aligned with said strip-like regions of said metal substrate sheet, said each region defining a plurality of openings which register with said die mounting portions of said metal substrate sheet and provided with a plurality of said conductive leads formed around said openings, c) a third step for producing a connected semiconductor die mounting sheet by heatsealing said circuit substrate sheet on said metal substrate sheet while aligning said die mounting portion of said metal substrate sheet with said opening of said circuit substrate sheet, said connected semiconductor die mounting sheet provided with a plurality of cavities each of which is defined by said each die mounting portion of said metal substrate sheet and said each opening of said circuit substrate sheet, d) a fourth step for producing a plurality of said semiconductor die mounting substrates which are connected in series in one direction and said side rails connected to respective sides of said semiconductor die mounting substrates in said each region defined in said connected semiconductor die mounting substrate sheet by forming a plurality of slits on said semiconductor die mounting substrates, said step further including forming a plurality of said positioning pilot apertures with reference to said respective cavities, and e) a fifth step for separating said frame made of connected semiconductor die mounting substrates along said strip-like region.

2. A method of producing a frame made of connected semiconductor die mounting substrates according to claim 1, wherein said circuit substrate sheet is provided with a copper film layer on a front surface thereof and a prepreg layer on a rear surface thereof.

3. A method of producing a frame made of connected semiconductor die mounting substrates, wherein i) a plurality of semiconductor die mounting substrates are connected in series in one direction by means of a plurality of connecting tabs, ii) said each semiconductor die mounting substrate has a die mounting portion at a central portion thereof and a plurality of conductive leads around said die mounting portion, and each conductive lead is provided with a wire bonding pad at an inner end thereof and a terminal pad at an outer end thereof and a solder resist layer is formed on said semiconductor die mounting substrate with an exception of said wire bonding pads and said terminal ends, iii) and a pair of side rails each of which is provided with a plurality of positioning pilot apertures are connected to respective sides of said connected semiconductor die mounting substrates by means of a plurality of connecting tabs, comprising:

a) a first step for preparing a metal substrate sheet which has an area capable of covering and defining a plurality of contiguous strip-like regions, said each strip-like region having an area capable of defining a plurality of said connected semiconductor die mounting substrates which are connected by said connecting tabs and said side rails connected to respective sides of said connected semiconductor die mounting substrates, said each strip-like region provided with a plurality of spaced-apart die mounting portions, b) a second step for preparing a circuit substrate sheet having an area which covers at least a plurality of said strip-like regions and forming said openings on circuit substrate sheet which respectively align with said die mounting portions defined in said respective strip-like region of said metal substrate sheet, c) a third step for producing a pressure-sealed laminated sheet by adhering said circuit substrate sheet having a plurality of openings prepared in said second step to a front surface of said metal substrate sheet, d) a fourth step for producing a plurality of pressure-sealed laminated plates which are connected in series in one direction and said side rails connected to respective sides of said pressure-sealed laminated plates, wherein said pressure-sealed laminated plates are produced by forming a plurality of slits on said pressure-sealed laminated sheet and said step further includes forming a plurality of said positioning pilot apertures in said side rails, e) a fifth step for providing a photoresist layer on said each pressure-sealed laminated plate, wherein a removable resin is filled in said opening of said circuit substareate sheeet and said surface of said circuit substrate sheet is made smooth and a pair of photoresist films are adhered to said front surface of said circuit substrate sheet and said rear surface of said metal substrate sheet respectively, f) a sixth step for exposing a lead pattern on said photoresist layer on said front surface of said circuit substrate sheet and removing non-exposed portions of said photoresist layer after developing and providing a plurality of conductive lead patterns on said circuit substrate sheet by removing said photoresist layer after effecting an ectching treatment and removing said resin filled in said opening, and g) a seventh step for separating said frame made of connected semiconductor die mounting substrates from said connected semiconductor die mounting substrate sheet along said strip-like region.

4. A method of producing a frame made of connected semiconductor die mounting substrates according to claim 3, wherein, in said fifth step, in place of said photoresist film, said metal substarate sheet which adheres said circuit substrate sheet on said front surface thereof is immersed in a photoresist liquid so as to provide a photoresist layer on an entire surface of said metal substrate sheet.

5. A method of producing a frame made of connected semiconductor die mounting substrates, wherein i) a plurality of semiconductor die mounting substrates are connected in series in one direction by means of a plurality of connecting tabs, ii) said each semiconductor die mounting substrate has a die mounting portion at a central portion thereof and a plurality of conductive leads around said die mounting portion, and each conductive lead is provided with a wire bonding pad at an inner end thereof and a terminal pad at an outer end thereof and a solder resist layer is formed on said semiconductor die mounting substrate with an exception of said wire bonding pads and said terminal ends, iii) and a pair of side rails each of which is provided with a plurality of positioning pilot apertures are connected to respective sides of said connected semiconductor die mounting substrates by means of a plurality of connecting tabs, comprising:

a) a first step for preparing a metal substrate sheet which has an area capable of covering and defining a plurality of connected strip-like regions, said each strip-like region having an area capable of defining a plurality of said connected semiconductor die mounting substrates which are connected by said connecting tabs and said side rails connected to respective sides of said connected semiconductor die mounting substrates, said each strip-like region provided with a plurality of spaced-apart die mounting portions, b) a second step for preparing a circuit substrate sheet having an area which covers at least a plurality of said strip-like regions and forming said openings on said circuit substrate sheet which respectively are aligned with said die mounting portions defined in said respective strip-like region of said metal substrate sheet, c) a third step for producing a pressure-sealed laminated sheet by adhering said circuit substrate sheet having a plurality of openings prepared in said second step to a front surface of said metal substrate sheet, d) a fourth step for providing a photoresist layer by firstly filling a removable resin in said opening of said circuit substrate sheet adhered in said third step and making the surface of said circuit substrate sheet smooth and adhering a pair of photoresist films on said front surface of said circuit substrate sheet and said rear surface of said metal substrate sheet respectively, e) a fifth step for producing said connected semiconductor die mounting substrate sheet by firstly exposing a lead pattern on said photoresist layer on said front suraface and removing non-exposed portions of said photoresist layer after developing and providing a plurality of said conductive leads on said circuit substrate sheet by removing said photoresist layer after effecting an ectching treatment and removing said resin filled in said opening, f) a sixth step for producing said semiconductor die mounting substrates which are connected in series in one direction and said side rails connected to respective sides of said semiconductor die mounting substrates by said connecting tabs in said semiconductor die mounting sheet by forming a plurality of slits in said semiconductor die mounting substrate, said step further including forming a plurality of said positioning pilot apertures in said side rails, and g) a seventh step for separating said frame made of connected semiconductor die mounting substrates from said connected semiconductor die mounting substrate sheet along said strip-like region.

6. A method of producing a frame made of connected semiconductor die mounting substrates according to claim 5, in said fourth step, in place of said photoresist film, said metal substarate sheet which adheres said circuit substrate sheet on said front surface thereof is immersed in photoresist liquid so as to provide a photoresist layer on an entire surface of said metal substrate sheet.

* * * * *

UNITED STATES PATENT AND TRADEMARK OFFICE
CERTIFICATE OF CORRECTION

PATENT NO. : 5,614,443
DATED : March 25, 1997
INVENTOR(S) : Takashi Nakashima, et. al.

It is certified that error appears in the above-identified patent and that said Letters Patent is hereby corrected as shown below:

Drawings:

The Drawing sheet 7 of 9, consisting of Figs 11 g, - 11 j should be deleted.

Column 7, line 13, change "Figs (g-j)" to read "Figs (a-d)"--

Signed and Sealed this

Twenty-fourth Day of August, 1999

Attest:

Q. TODD DICKINSON

Attesting Officer    Acting Commissioner of Patents and Trademarks

UNITED STATES PATENT AND TRADEMARK OFFICE
CERTIFICATE OF CORRECTION

PATENT NO. : 5,614,443
DATED : March 25, 1999
INVENTOR(S) : Takahashi NAKASHIMA et al.

It is certified that error appears in the above-identified patent and that said Letters Patent is hereby corrected as shown below:

Change the number of drawing sheets listed on the title page of the patent from "9" to --8--.

Figure 11A:
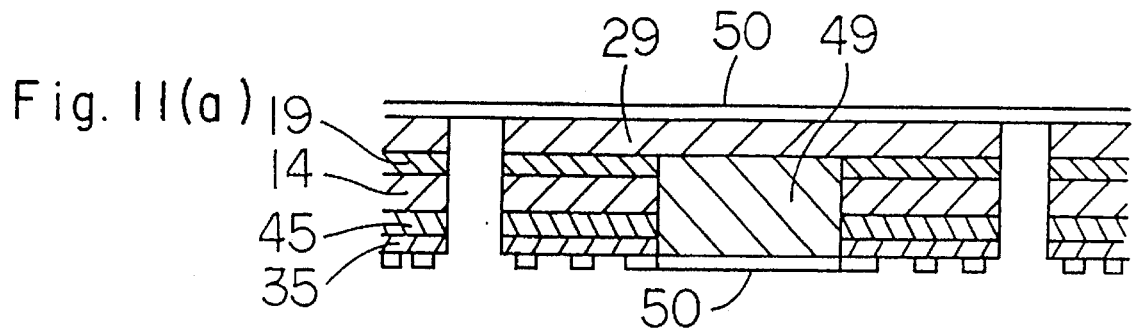
FIGS. 11 (g–j) is a block diagram showing the manner of producing the frame according to the second embodiment of the present invention.
Figure 11B:
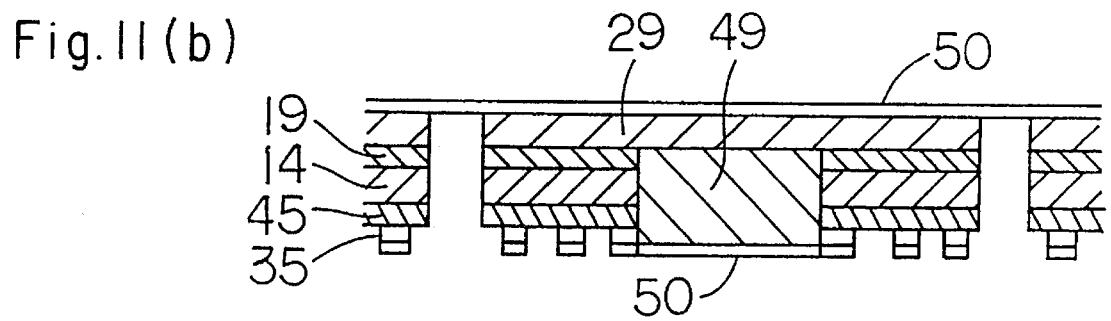
Figure 11C:
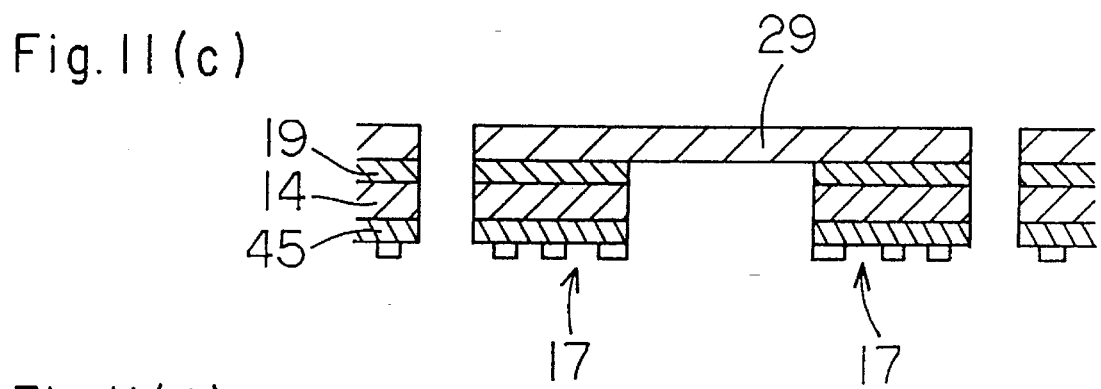
Figure 11D:
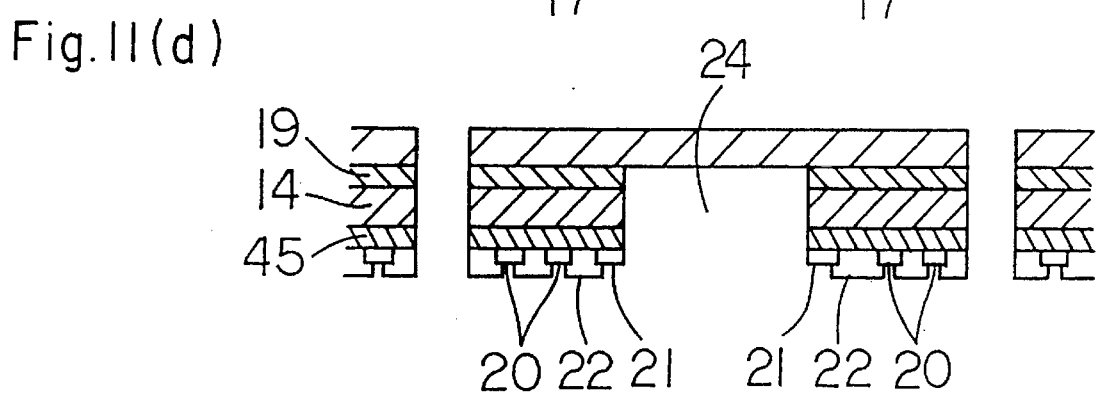
Figure 11G:
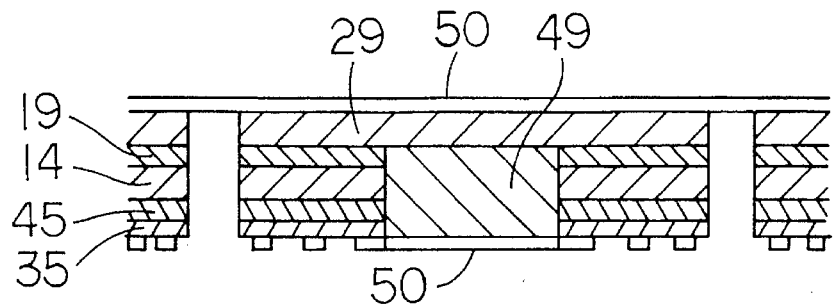
Figure 11H:
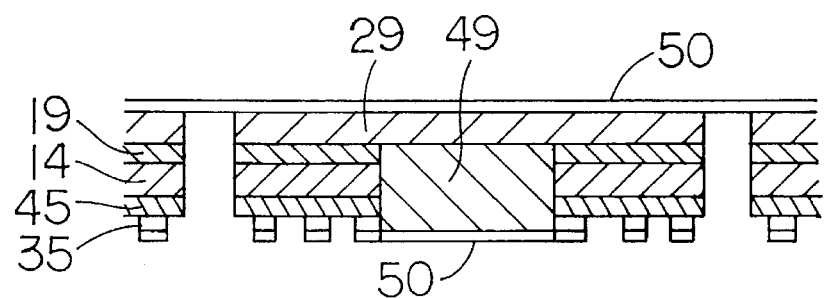
Figure 11I:
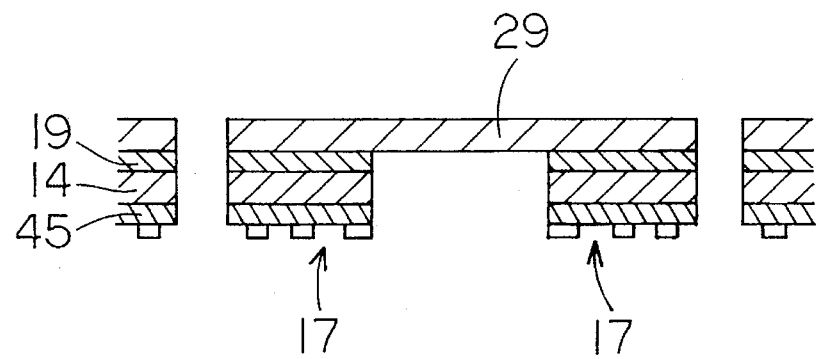
Figure 11J:
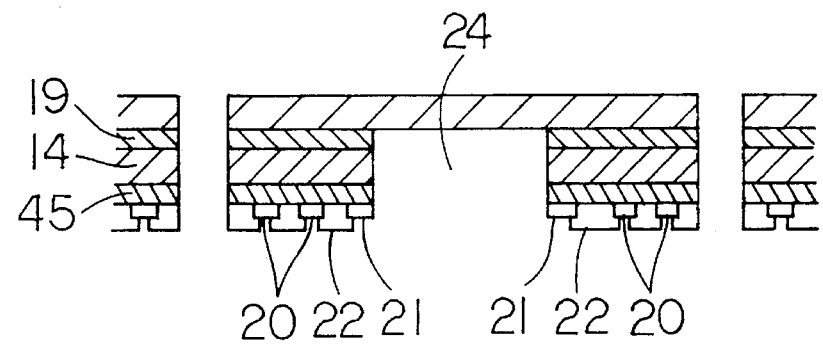
Figure 12:
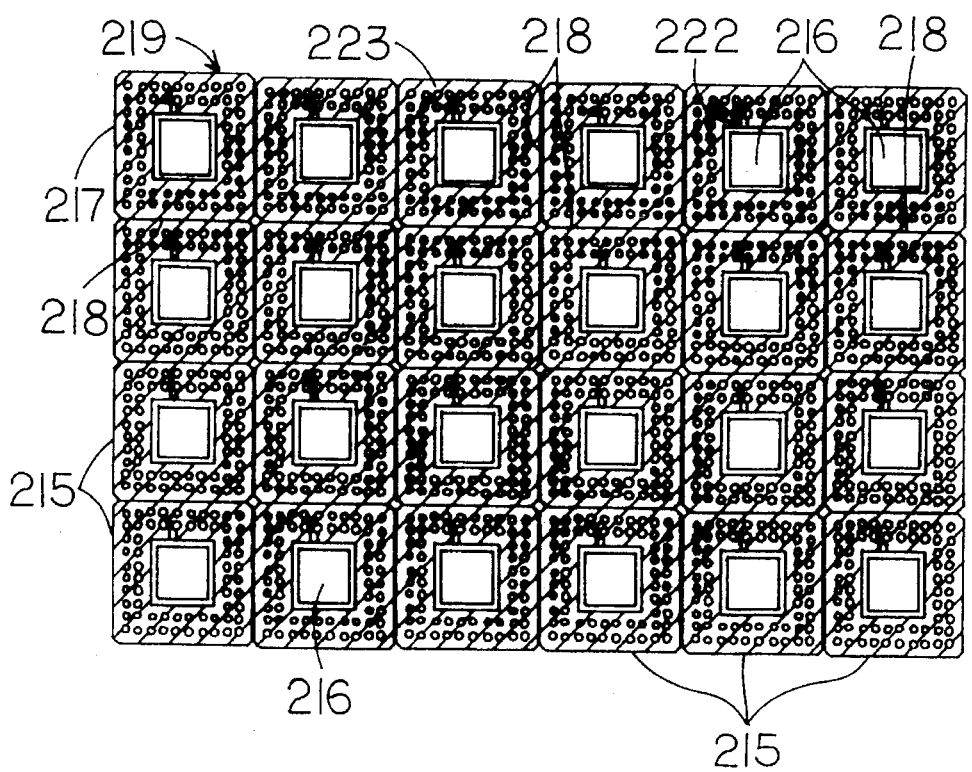
FIG. 12 is a plan view of a semiconductor die mounting substrate sheet produced by a conventional method of producing semiconductor die mounting substrate sheet.
Figure 13:
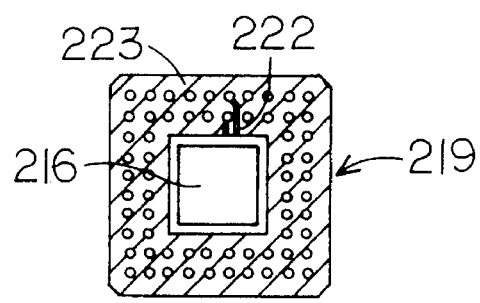
FIG. 13 is a plan view of a semiconductor die mounting substrate which constitutes the semiconductor die mounting substrate sheet.
Figure 14:
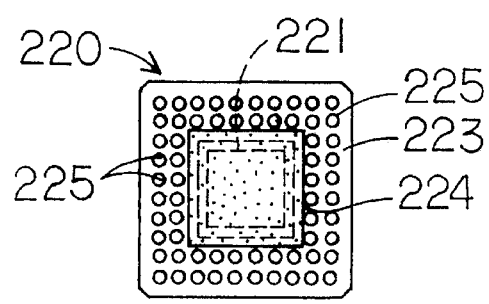
FIG. 14 is a plan view of a semiconductor device.

Change the pagination in each Sheet in the Figures to read as follows:
Change "Sheet 1 of 9" containing Fig. 1 and Fig. 2 to --Sheet 1 of 8--;
Change "Sheet 2 of 9" containing Fig. 3 and Fig. 4 to --Sheet 2 of 8--;
Change "Sheet 3 of 9" containing Fig. 5, Fig. 6(a), and Fig. 6 to --Sheet 3 of 8--;
Change "Sheet 4 of 9" containing Fig. 7 and Fig. 8 to --Sheet 4 of 8--;
Change "Sheet 5 of 9" containing Fig. 9 and Fig. 9(a) to --Sheet 5 of 8--;

Change "Sheet 6 of 9" containing Fig. 10(a), Fig. 10(b), Fig. 10(c), Fig. 10(d),
  Fig. 10(e), and Fig. 10(f) to --Sheet 6 of 8--;

Delete "Sheet 7 of 9" containing Fig. 11(a); Fig. 11(b); Fig. 11(c), and
  Fig. 11(d);

Change "Sheet 8 of 9" containing Fig. 11(g), Fig. 11(h); Fig. 11(i), and
  Fig. 11(j) to --Sheet 7 of 8--; and Change "Sheet 9 of 9" containing Fig. 12, Fig. 13, and Fig. 14 to --Sheet 8 of 8--.

Signed and Sealed this

Twelfth Day of December, 2000

*Attest:*

Q. TODD DICKINSON

*Attesting Officer*   *Director of Patents and Trademarks*